(12) United States Patent
Denis

(10) Patent No.: US 10,989,604 B1
(45) Date of Patent: Apr. 27, 2021

(54) CRYOGENIC DETECTOR WITH INTEGRATED BACKSHORT AND METHOD OF MANUFACTURING THEREOF

(71) Applicant: United States of America as represented by the Administrator of NASA, Washington, DC (US)

(72) Inventor: Kevin Denis, Greenbelt, MD (US)

(73) Assignee: United States of America as represented by the Administrator of NASA, Washington, DC (US)

( * ) Notice: Subject to any disclaimer, the term of this patent is extended or adjusted under 35 U.S.C. 154(b) by 32 days.

(21) Appl. No.: 16/585,509

(22) Filed: Sep. 27, 2019

Related U.S. Application Data

(60) Provisional application No. 62/834,572, filed on Apr. 16, 2019.

(51) Int. Cl.
  *G01J 5/20* (2006.01)
  *G01J 5/34* (2006.01)

(52) U.S. Cl.
  CPC . *G01J 5/20* (2013.01); *G01J 5/34* (2013.01); *G01J 2005/208* (2013.01)

(58) Field of Classification Search
  CPC .......... G01J 5/20; G01J 5/34; G01J 2005/208
  See application file for complete search history.

(56) References Cited

U.S. PATENT DOCUMENTS 9,383,254 B1 * 7/2016 U-yen ................... G01J 5/0853

* cited by examiner

*Primary Examiner* — Mark R Gaworecki
(74) *Attorney, Agent, or Firm* — Heather Goo; Bryan A. Geurts; Helen M. Gaius

(57) ABSTRACT

The present invention relates to an integrated reflective backshort fabricated with a phononic-isolated kinetic inductance detector or transition edge sensor. The integrated backshort includes: a silicon wafer; a reflective metal layer bonded to the silicon wafer; a silicon first layer disposed on the reflective metal layer; a structural second layer disposed on the first layer; a first superconductor layer disposed on the second layer as a kinetic inductance detector; and a second superconductor layer disposed on the second layer as leads, a microstrip, a capacitor or filter; wherein a phononic structure is etched in the second layer, leaving holes in the second layer; and wherein the etching penetrates through the holes into the second layer, and stopping on the reflective metal layer, leaving a space under the second layer where edges of the first layer etched under the second layer define a length of the integrated backshort.

20 Claims, 3 Drawing Sheets

CRYOGENIC DETECTOR WITH INTEGRATED BACKSHORT AND METHOD OF MANUFACTURING THEREOF

CROSS-REFERENCE TO RELATED APPLICATIONS

The present application claims priority from U.S. Provisional Patent Application No. 62/834,572, filed Apr. 16, 2019, the contents of which are herein incorporated by reference in their entirety. The present invention is related to co-pending U.S. patent application entitled "Phononic-isolated Kinetic Inductance Detector and Fabrication Method Thereof", filed Sep. 27, 2019, application Ser. No. 16/585,559, and "Phononic Devices and Methods of Manufacturing Thereof", filed Sep. 27, 2019, application Ser. No. 16/585,496, the contents of both of which are herein incorporated by reference in their entirety.

ORIGIN OF THE INVENTION

The invention described herein was at least in-part made by an employee of the United States Government and may be manufactured or used by or for the Government of the United States of America for governmental purposes without the payment of any royalties thereon or therefor.

BACKGROUND OF THE INVENTION

1. Field of the Invention

The present invention relates to an integrated backshort fabricated with a phononic-isolated microwave kinetic inductance detector (KID) or transition edge sensor (TES), and the method of manufacturing thereof.

2. Description of the Related Art

Kinetic inductance detectors (KIDs) are highly scalable to large format arrays but are not as sensitive as transition edge sensor (TES) bolometers, and have not demonstrated noise equivalent power (NEP) less than $10^{-19}$ W/rt-Hz, and are limited by the generation recombination rate of quasiparticles (qp) in the superconducting film.

Thus, phononic devices such as KIDs and TES devices can be isolated and where, as in KIDs, the qp generation recombination rate can be reduced, the noise equivalent power (NEP) can be reduced without sacrificing the scalability. Further, a silicon backshort which can be integrated to TES-based or KID superconducting detectors, is desired.

SUMMARY OF THE INVENTION

The present invention relates to an integrated reflective backshort fabricated with a phononic-isolated microwave kinetic inductance detector (KID) or transition edge sensor (TES), and the method of manufacturing thereof.

In one embodiment, highly sensitive superconducting cryogenic detectors integrate phononic crystals into their architecture. The phononic structures are designed to reduce the loss of athermal phonons from the superconductor, resulting in lower noise and higher sensitivity detectors. This fabrication process decreases the qp generation recombination rate, thus, reducing the noise equivalent power (NEP) without sacrificing the scalability. A plurality of phononic devices, such as a kinetic inductance detector or a transition edge sensor (TES) can be manufactured according to the methods of the present invention. In one embodiment, a silicon backshort is fabricated to TES-based superconducting detectors for a variety of astrophysical observations.

In one embodiment, a detector according to the present invention, is fabricated including a silicon handle wafer which supports a dielectric membrane on a frame; and disposing a superconductor material on the membrane; wherein a phononic crystal pattern having holes is etched in the dielectric membrane; and wherein a phonon bandgap centered at 2Δ restricts an escape of recombination and athermal phonons from the superconducting material. In one embodiment, when the phonon bandgap is matched to a phonon pair-breaking frequency of the superconductor material at 2Δ, a quasiparticle lifetime is increased.

In one embodiment, phononic filters are created by etching quasi-periodic nanoscale structures into the membrane, and a phonon stop-band is tuned by adjusting a scale of the quasi-periodic nanoscale structures to the frame. In one embodiment, a cross-sectional dimension of the etched features is less than a thermal wavelength at an operating temperature, enabling coherent phonon transport to take place. In one embodiment, a length of the membrane and phononic crystal combined is less than a phonon mean-freepath. In one embodiment, the membrane is patterned into phononic crystal rising electron-beam lithography or focused ion-beam milling.

Based upon the above, in one embodiment, a plurality of phononic devices including a phononic isolated Kinetic Inductance Detector (KID) and a transition edge sensor (TES) bolometer, were fabricated. In one embodiment, the fabrication process of the integrated backshort used with the KID and TES bolometer of the present invention follows The present invention can be achieved by the following fabrication process.

In one embodiment, a method of manufacturing an integrated backshort includes: providing a silicon wafer with a reflective metal layer bonded thereon, and with a silicon first layer deposited on the reflective metal layer; depositing a structural second layer on the first layer; depositing, patterning and etching a first superconductor layer as a kinetic inductance detector (KID) on the second layer; depositing, patterning and etching a second superconductor layer on the second layer as leads, a microstrip, a capacitor or a filter; and patterning and etching a phononic structure in the second superconductor layer and the first layer, leaving holes in the second layer; wherein the etching penetrates through the holes into the second layer, and into the first layer, and stopping on the reflective metal layer, leaving a space under the second layer where edges of the first layer which are etched under the second layer define a length of the integrated backshort.

In one embodiment, prior to providing the silicon wafer, the method further includes: providing a silicon-on-insulator (SOI), including a first removable silicon wafer bonded to a silicon oxide layer, the silicon oxide layer which forms a bilayer with the silicon first layer; depositing the metal reflective layer on the silicon-on-insulator to form a layered wafer; turning over the layered wafer and removing the first removable silicon wafer and the silicon oxide layer, exposing the silicon first layer.

In one embodiment, the method of providing an integrated backshort further includes: bonding the first removable silicon wafer to the reflective metal layer using a polymer.

In one embodiment, a thickness of the silicon wafer provides a quarter (¼) or three-quarter (¾) wave phase-delay of input light.

In one embodiment, the first superconductor layer is etched to function as a kinetic inductance detector (KID), and a thickness of said second layer is based on predetermined properties of a phononic crystal.

In one embodiment, the structural material of the second layer includes one of silicon nitride ($SiN_x$), an alloy including aluminum oxide ($Al_2O_3$,) a diamond, or another dielectric material that is not silicon.

In one embodiment, the second layer is deposited on the first layer using a low temperature process.

In one embodiment, the reflective metal layer is a gold layer.

In one embodiment, the first superconductor layer includes hafnium (Hf).

In one embodiment, the second superconductor layer includes niobium (Nb).

In one embodiment, the method of providing an integrated backshort further includes: removing the first removable silicon wafer and the silicon oxide layer using a hydrofluoric acid (HF) solution.

In one embodiment, the method of providing an integrated backshort further includes: coating and patterning a photoresist on the layered wafer; removing the photoresist by oxygen plasma; and etching the second layer and the first layer by electron beam lithography and oxygen plasma.

In one embodiment, the method of providing an integrated backshort further includes: etching the first layer using a xenon fluoride ($XeFe_2$) gas phase chemistry; wherein the holes allow for the xenon difluoride gas phase chemistry to react and etch the first layer isotropically, leaving a vacuum gap between the first superconductor layer and the reflective metal layer.

In one embodiment, an integrated backshort includes: a silicon wafer; a reflective metal layer bonded to the silicon wafer; a silicon first layer disposed on the reflective metal layer; a structural second layer disposed on the first layer; a first superconductor layer disposed on the second layer as a kinetic inductance detector (KID); and a second superconductor layer disposed on the second layer as one of leads, a microstrip, a capacitor or a filter; wherein a phononic structure is etched in the second layer, leaving holes in the second layer; and wherein subsequent etching penetrates through the holes into the second layer, and into the first layer, and stopping on the reflective metal layer, leaving a space under the second layer where edges of the first layer which are etched under the second layer define a length of the integrated backshort.

Thus, has been outlined, some features consistent with the present invention in order that the detailed description thereof that follows may be better understood, and in order that the present contribution to the art may be better appreciated. There are, of course, additional features consistent with the present invention that will be described below, and which will form the subject matter of the claims appended hereto.

In this respect, before explaining at least one embodiment consistent with the present invention in detail, it is to be understood that the invention is not limited in its application to the details of construction and to the arrangements of the components set forth in the following description or illustrated in the drawings. Methods and apparatuses consistent with the present invention are capable of other embodiments and of being practiced and carried out in various ways. Also, it is to be understood that the phraseology and terminology employed herein, as well as the abstract included below, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the methods and apparatuses consistent with the present invention.

BRIEF DESCRIPTION OF THE DRAWINGS

The description of the drawings includes exemplary embodiments of the disclosure and are not to be considered as limiting in scope.

DESCRIPTION OF THE INVENTION

Figure 1A:
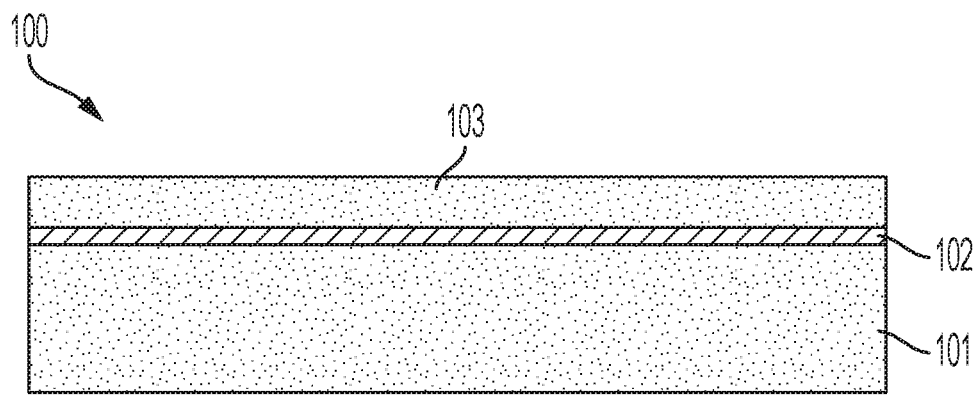
FIGS. 1A-1I depict a fabrication process of an integrated backshort according to one embodiment consistent with the present invention.

The present invention relates to an integrated reflective backshort fabricated with a phononic-isolated microwave kinetic inductance detector (KID) or transition edge sensor (TES), and the method of manufacturing thereof.

In one embodiment, highly sensitive superconducting cryogenic detectors integrate phononic crystals into their architecture. The phononic structures are designed to reduce the loss of athermal phonons from the superconductor, resulting in lower noise and higher sensitivity detectors. This fabrication process increases the qp generation recombination time, thus, reducing the noise equivalent power (NEP) without sacrificing the scalability. A plurality of phononic devices, such as a kinetic inductance detector or a transition edge sensor (TES) can be manufactured according to the methods of the present invention. In one embodiment, a silicon backshort is fabricated to TES-based superconducting detectors for astrophysical observations.

In the present invention, a variety of phononic device geometries have been fabricated including two dimensional (2D) meshes as well as one dimensional (1D) structures articulated by bends and T-shaped features. In the present invention, transition edge sensor (TES) devices were fabricated on a beam-isolated 110 mm×140 mm membrane.

More specifically, phononic filters were created by etching quasi-periodic nanoscale structures into supporting thermo-mechanical beams. The cross-sectional dimensions of the etched features are less than the thermal wavelength at the operating temperature, enabling coherent phonon transport to take place in one dimension. The phonon stop-band can be tuned by adjusting the scale of the quasi-periodic structures. Cascading multiple filter stages can increase bandwidth and provide improved thermal (phononic) isolation similar to the function of a multi-stage electrical filter. Since phonons can propagate coherently through a solid medium at temperatures below ~200 mK, this attribute was utilized to design structures such that there is a phononic bandgap that blocks modes of heat flow through the beams.

In one embodiment, a phonon bandgap restricting the escape rate of recombination phonons from a superconducting film has a strong effect on the quasiparticle dynamics. In the present invention, the quasiparticle lifetime $\tau_{qp}$, is increased by more than an order of magnitude for realistic bandgap properties that can be achieved with phononic crystals. When the pair-breaking photon rate is low, the enhancement in the quasiparticle lifetime calculated using nonequilibrium particle distributions is in good quantitative agreement with an equilibrium formulation. The enhancement in $\tau_{qp}$ has a significant impact in superconducting devices where quasiparticle fluctuation plays an important role in limiting the sensitivity and responsivity to pair-breaking photons. In addition, $\tau_{qp}$ is sensitive to the position of the phonon bandgap. This response provides a useful probe for phonon coupling in low-dimensional thin films. By symmetry of the phonon transport across a phononic crystal, an isolated superconductor of the present invention will be less susceptible to pair-breaking phonon-mediated quasiparticle poisoning.

In one embodiment, a detector according to the present invention, is fabricated including a silicon handle wafer which supports a dielectric membrane on a frame; and disposing a superconductor material on the membrane; wherein a phononic crystal pattern is etched in the dielectric membrane; and wherein a phonon bandgap centered at $2\Delta$ restricts an escape of recombination and athermal phonons from the superconducting material. In one embodiment, when the phonon bandgap is matched to a phonon pair-breaking frequency of the superconductor material at $2\Delta$, a quasiparticle lifetime is increased.

In one embodiment, phononic filters are created by etching quasi-periodic nanoscale structures into the membrane, and a phonon stop-band is tuned by adjusting a scale of the quasi-periodic nanoscale structures to the frame. In one embodiment, a cross-sectional dimension of the etched features is less than a thermal wavelength at an operating temperature, enabling coherent phonon transport to take place. In one embodiment, a length of the membrane and phononic crystal combined is less than a phonon mean-free-path. In one embodiment, the membrane is patterned into a phononic crystal using electron-beam lithography or focused ion-beam milling.

Based upon the above, in one embodiment, a plurality of phononic devices including a phononic isolated Kinetic Inductance Detector (KID) and a transition edge sensor (TES) bolometer, were fabricated. Specific details of each process (i.e., etching, patterning, etc.) are not disclosed herein as they should be familiar to one of ordinary skill in the art.

In one embodiment, the fabrication process of the integrated backshort used with the KID and TES bolometer of the present invention follows the novel steps depicted in FIGS. 1A-1I.

In one embodiment, as shown in FIG. 1A, the integrated backshort fabrication process starts with a silicon-on-insulator (SOI) 100 as shown in FIG. 1A, or more specifically, a silicon wafer 101 bonded with a thin layer of silicon oxide ($SiO_x$) 102 layer, which forms a bilayer with a thin film of silicon (Si) 103. In one embodiment, the silicon 103 thickness is set to provide a quarter (¼) or three-quarter (¾) wave phase-delay of input light.

Figure 1B:
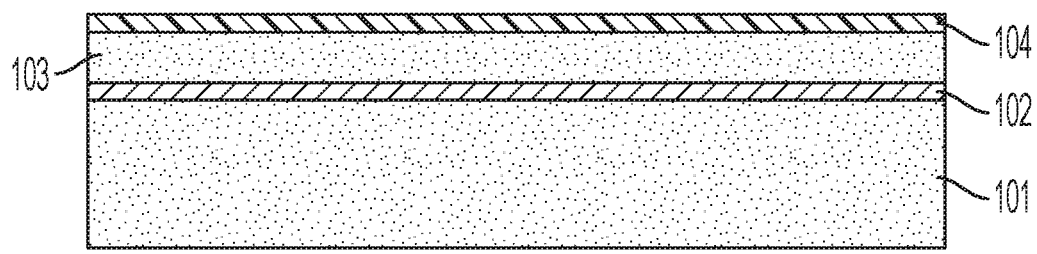

In one embodiment, as shown in FIG. 1B, a thin reflective layer 104 of metal (e.g., gold (Au)) is deposited on the silicon layer 103.

Figure 1C:
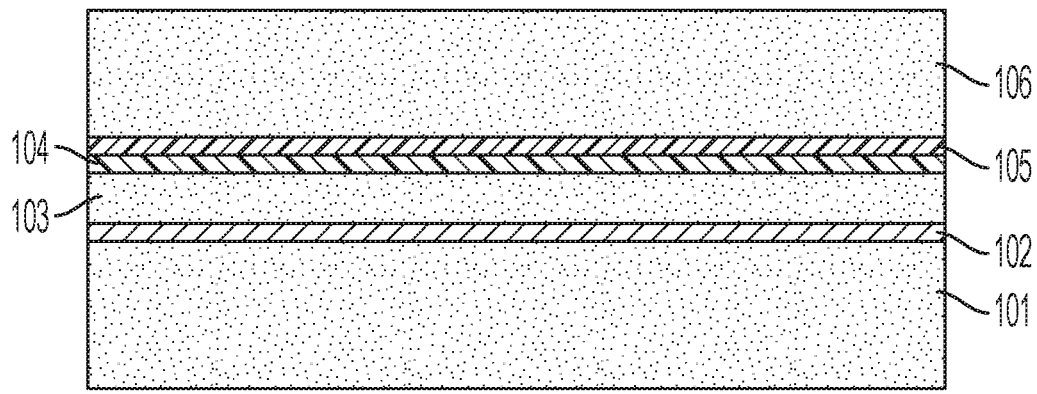

In one embodiment, as shown in FIG. 1C, a second silicon wafer 106 is bonded to the metal layer 104 using a polymer 105.

Figure 1D:
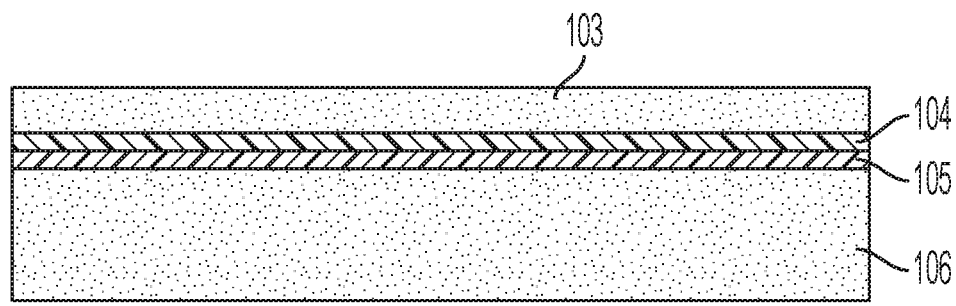
Figure 1E:
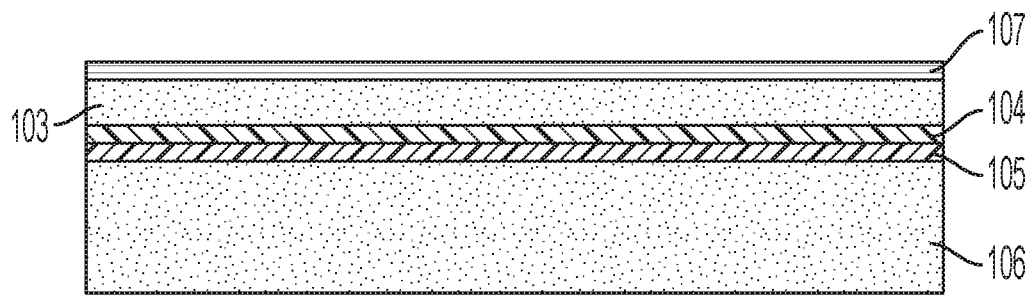
Figure 1F:
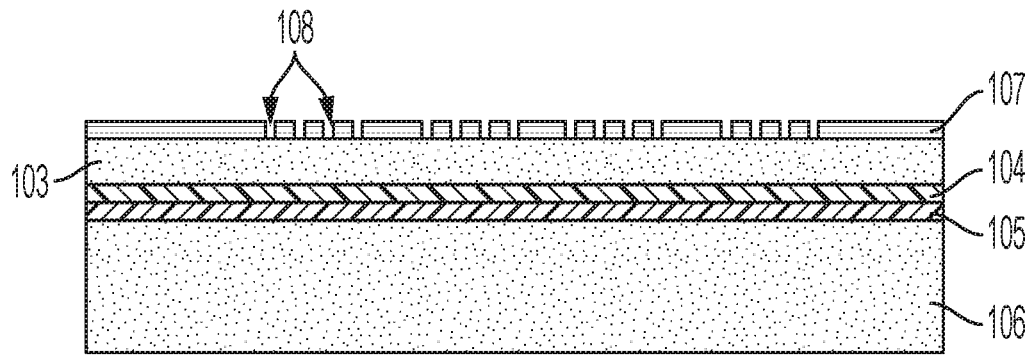

In one embodiment, the layered wafer 101 is flipped over as shown in FIG. 1D, and the first silicon wafer 101, now on the top, is lapped or etched off, along with the silicon oxide layer 102, using hydrofluoric acid (HF) solution, exposing the silicon layer 103.

In one embodiment, a layer 107 of structural material such as a $SiN_x$ structural material or an alloy such as $Al_2O_3$, a diamond or other dielectric material not including silicon, is deposited on the thin film silicon layer 103 using a low temperature process (e.g., PECVD, evaporation, ALD, sputter, etc.) (see FIG. 1E).

In one embodiment, the thickness of the silicon nitride 107 thin film is chosen based on the desired phononic crystal 102/103 properties.

In one embodiment, the phononic structure is patterned and etched (see FIG. 1F) in the layer 107 by electron beam lithography and fluorine plasma, leaving holes or gaps 108 which do not extend through the silicon layer 103 (i.e., the etching stops on silicon layer 103).

Figure 1G:
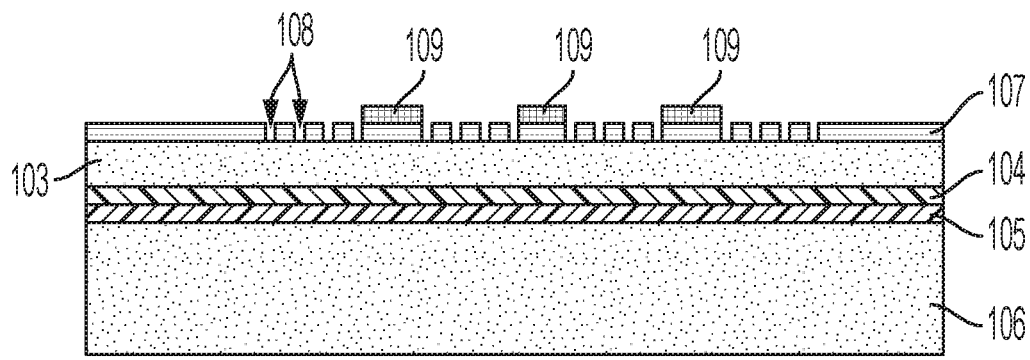

In one embodiment, a superconductor layer 109, including a hafnium (Hf) material or other superconductor material etched to function as a KID, or microwave kinetic inductance detector (MKID), is deposited and patterned on the etched layer 107 (e.g., silicon nitride) (see FIG. 1G).

Figures 1, 1H:
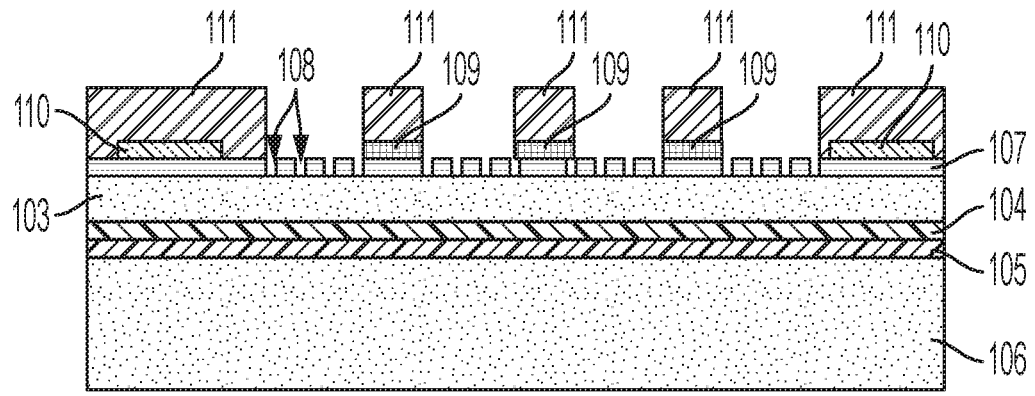
Figures 1, 1H, 2:
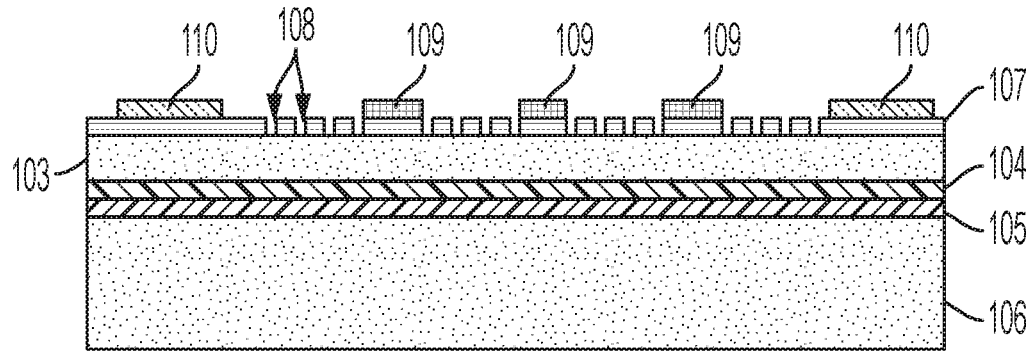

In one embodiment, a superconductor material 110, including niobium (Nb) or other superconductor material, is deposited on the dielectric (e.g., $SiN_x$) layer 107, as leads or microstrip or capacitor or filter (see FIGS. 1H(1)-1H(2)).

Figure 1I:
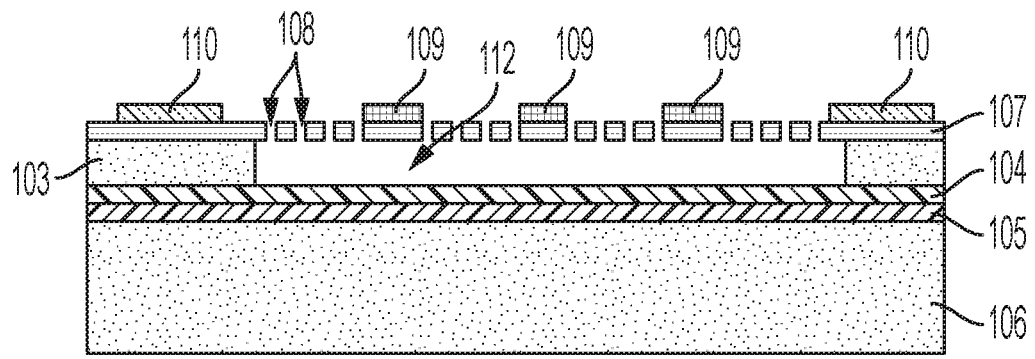

In one embodiment, a photoresist 111 is coated and patterned over the layered wafer 106 (see FIG. 1H(1)), and after patterning the photoresist, the layer wafer is etched, where the etching penetrates between the gaps 108 and into the silicon layer 103, stopping on the gold (Au) layer 104, leaving a space 112 under layer 107 (see FIG. 1I). The edges of the silicon layer 103 which is cut into, and which defines the edges of the space 112, sets the length of the backshort distance, by setting the thickness of the layer 103, with an accuracy of one tenth of a micron.

In one embodiment, a xenon fluoride ($XeFe_2$) gas phase chemistry was used to etch the underlying silicon layer 103 to achieve the space 112. The phononic holes 108 allow for the gas to react and etch the layered wafer isotropically. The photoresist protects the other layers.

In one embodiment, the photoresist 111 was stripped off with oxygen plasma.

In one embodiment, the present invention can be used with standard KID or TES devices. In the present invention, the holes 108 in the membrane perform the function of both allowing access of the etching chemistry to etch the underlying silicon film 103 as well as a phononic structure. For a standard microwave kinetic inductance detector (MKID) or transition edge sensor (TES) the holes would just be available for the chemical etching.

The integrated backshort of the present invention as shown in FIG. 1I, has significant advantages. The backshort spacing in the novel process of the present invention is defined by the highly accurate and uniform thickness of the silicon-on-insulator (SOI) 103.

The present invention provides advantages over current processes. In the present invention, etching processes to create the nanoscale membranes are all dry plasma chemistry. Further, no removal of the handle wafer 106 to create the membrane is required, which typically involves temporarily bonding the layered wafer to a separate handle wafer with wax or polymer then etching high aspect ratio trenches via a deep reactive silicon ion etch. Thereafter, typical methods of soaking the bonded wafer in liquid to dissolve wax or polymer, and subsequent drying, could result in surface tension damaging to the fragile membranes. Additionally, less handling of the fragile membranes occurs in the release process of the present invention, and the fewer number of process steps to create the integrated backshort of the present invention makes it less costly.

Additionally, disadvantages of current processes which the present invention avoids, include the standard high aspect ratio etch through a thick wafer 106 on the order of 500 μm which makes results difficult in controlling the packing density of the detectors since the angle through layer 106 is not perfectly 90 degrees. The standard method of bonding a separately fabricated backshort to the detector wafer requires extensive cleaning of the bonding surfaces, difficult alignment processes, and additional complication of the requirement to produce a separate backshort part.

However, in utilizing the silicon 103 from a silicon-on-insulator (SOI) wafer 100 of the present invention as the sacrificial material incorporated by bonding with a polymer, this arrangement has the further benefit that the silicon layer thickness 103 will not have the topography that would result when depositing a thick film. The silicon layer is planar. Further the silicon dielectric 103 material is matched thermally to the silicon wafer. For cryogenic applications this will result in minimal thermal stress during cooling, whereas other implementations utilizing a thick polymer sacrificial material may result in thermal mismatch and cracking especially for longer wavelength backshorts. Finally, the silicon layer 106 can be made from a high resistivity low defect density float-zone process, resulting in minimal parasitic microwave loss for kinetic inductance detector (KID) applications.

The present invention would be advantageous in any commercial application that requires very high-performance cryogenic detectors. Further, the process of the present invention could potentially enable single photon calorimetry in ultraviolet (UV) to infrared (IR) applications.

It should be emphasized that the above-described embodiments of the invention are merely possible examples of implementations set forth for a clear understanding of the principles of the invention. Variations and modifications may be made to the above-described embodiments of the invention without departing from the spirit and principles of the invention. All such modifications and variations are intended to be included herein within the scope of the invention and protected by the following claims.

What is claimed is:

1. A method of manufacturing an integrated backshort, the method comprising:
   providing a silicon wafer with a reflective metal layer bonded thereon, and with a silicon first layer deposited on said reflective metal layer;
   depositing a structural second layer on said first layer;
   depositing, patterning and etching a first superconductor layer on said second layer as a kinetic inductance detector (KID);
   depositing and patterning a second superconductor layer on said second layer as one of leads, a microstrip, a capacitor or a filter; and
   patterning and etching a phononic structure in said second layer and said first layer, leaving holes in said second layer;
   wherein subsequent etching penetrates through said holes into said second layer, and into said first layer, and stopping on said reflective metal layer, leaving a space under said second layer where edges of said first layer which are etched under said second layer define a length of the integrated backshort.

2. The method of claim 1, wherein prior to providing said silicon wafer, the method further comprises:
   providing a silicon-on-insulator (SOI), including a first removable silicon wafer bonded to a silicon oxide layer, said silicon oxide layer which forms a bilayer with said silicon first layer;
   depositing said metal reflective layer on said silicon-on-insulator to form a layered wafer;
   turning over said layered wafer and removing said first removable silicon wafer and said silicon oxide layer, exposing said silicon first layer.

3. The method of claim 2, the method further comprising:
   bonding said first removable silicon wafer to said reflective metal layer using a polymer.

4. The method of claim 2, the method further comprising:
   removing said first removable silicon wafer and said silicon oxide layer using a hydrofluoric acid (HF) solution.

5. The method of claim 4, the method further comprising:
   coating and patterning a photoresist on said layered wafer; and
   etching said second layer and said first layer by electron beam lithography and fluorine plasma and etching said photoresist layer with oxygen plasma.

6. The method of claim 5, the method further comprising:
   etching said first layer using a xenon fluoride (XeFe$_2$) gas phase chemistry;
   wherein said holes allow for said xenon fluoride gas phase chemistry to react and etch said first layer isotropically, leaving a vacuum gap between said first superconductor layer and said reflective metal layer.

7. The method of claim 1, wherein a thickness of said silicon wafer provides a quarter (¼) or three-quarter (¾) wave phase-delay of input light.

8. The method of claim 1, wherein said structural material of said second layer comprises one of silicon nitride (SiN$_x$), an alloy including aluminum oxide (Al$_2$O$_3$), a diamond or another dielectric material not including silicon.

9. The method of claim 8, wherein said first superconductor layer is etched to function as a kinetic inductance detector (KID), and a thickness of said second layer is based on predetermined properties of a phononic crystal.

10. The method of claim 9, wherein said second layer is deposited on said first layer using a low temperature process.

11. The method of claim 9, wherein said reflective metal layer is a gold layer.

12. The method of claim 11, wherein said first superconductor layer comprises hafnium (Hf).

13. The method of claim 12, wherein said second superconductor layer comprises niobium (Nb).

14. An integrated backshort, the backshort comprising:
    a silicon wafer;
    a reflective metal layer bonded to said silicon wafer;
    a silicon first layer disposed on said reflective metal layer;
    a structural second layer disposed on said first layer;
    a first superconductor layer disposed on said second layer as a kinetic inductance detector (KID); and
    a second superconductor layer disposed on said second layer as one of leads, a microstrip, a capacitor or a filter;
    wherein a phononic structure is etched in said second layer, leaving holes in said second layer; and
    wherein subsequent etching penetrates through said holes into said second layer, and into said first layer, and stopping on said reflective metal layer, leaving a space under said second layer where edges of said first layer which are etched under said second layer define a length of the integrated backshort.

15. The integrated backshort of claim 14, wherein said reflective metal layer comprises a gold layer.

16. The integrated backshort of claim 15, wherein said first superconductor layer comprises hafnium (Hf).

17. The integrated backshort of claim 16, wherein said second superconductor layer comprises niobium.

18. The integrated backshort of claim 17, wherein said second layer comprises one of silicon nitride, an alloy including aluminum oxide ($Al_2O_3$,) a diamond or another dielectric material not including silicon.

19. The integrated backshort of claim 18, wherein said first superconductor layer is etched to function as a kinetic inductance detector (KID), and a thickness of said second layer is based on predetermined properties of a photonic crystal.

20. The integrated backshort of claim 15, wherein a thickness of said silicon wafer provides a quarter (¼) or three-quarter (¾) wave phase-delay of input light.

* * * * *

UNITED STATES PATENT AND TRADEMARK OFFICE
CERTIFICATE OF CORRECTION

PATENT NO. : 10,989,604 B1
APPLICATION NO. : 16/585509
DATED : April 27, 2021
INVENTOR(S) : Kevin Denis It is certified that error appears in the above-identified patent and that said Letters Patent is hereby corrected as shown below:

On the Title Page

ITEM (72), CHANGE INVENTOR ADDRESS FROM "Greenbelt, REPUBLIC OF MOLDOVA" TO "Greenbelt, MD"

Signed and Sealed this
Tenth Day of May, 2022

Katherine Kelly Vidal
*Director of the United States Patent and Trademark Office*